(12) United States Patent
Sakai et al.

(10) Patent No.: US 11,337,301 B2
(45) Date of Patent: May 17, 2022

(54) PRINTED CIRCUIT BOARD TO SUPPRESS DETERIORATION OF AN ELECTRICAL BALANCE IN A DIFFERENTIAL LINE

(71) Applicant: MITSUBISHI ELECTRIC CORPORATION, Tokyo (JP)

(72) Inventors: Ayumi Sakai, Tokyo (JP); Fujiyuki Nakamoto, Tokyo (JP); Yuichi Sasaki, Tokyo (JP); Naoto Oka, Tokyo (JP); Hideyuki Ohashi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 208 days.

(21) Appl. No.: 16/606,374

(22) PCT Filed: Jun. 2, 2017

(86) PCT No.: PCT/JP2017/020622
§ 371 (c)(1),
(2) Date: Oct. 18, 2019

(87) PCT Pub. No.: WO2018/220823
PCT Pub. Date: Dec. 6, 2018

(65) Prior Publication Data
US 2021/0337658 A1    Oct. 28, 2021

(51) Int. Cl.
*H05K 1/02* (2006.01)
*H02H 9/04* (2006.01)

(52) U.S. Cl.
CPC .............. *H05K 1/0257* (2013.01); *H02H 9/04* (2013.01)

(58) Field of Classification Search
CPC ......... H05K 1/141; H05K 1/0257; H02H 9/04
(Continued)

(56) References Cited

U.S. PATENT DOCUMENTS

2006/0066417 A1* 3/2006 Yamanaga ................ H01P 5/02
  333/33
2012/0025924 A1* 2/2012 Yamauchi ............ H05K 1/0253
  333/4

(Continued)

FOREIGN PATENT DOCUMENTS

| JP | 2006-128618 A | 5/2006 | |
| JP | 2015-35468 A | 2/2015 | |
| JP | 2015035468 A * | 2/2015 | ............... H05K 3/46 |

OTHER PUBLICATIONS

International Search Report (PCT/ISA/210) issued in PCT/JP2017/020622, dated Aug. 29, 2017.

(Continued)

*Primary Examiner* — Yemane Mehari
(74) *Attorney, Agent, or Firm* — Birch, Stewart, Kolasch & Birch, LLP

(57) ABSTRACT

A printed circuit board includes a line formation layer including a differential line having a first conductor and a second conductor, a first component for a countermeasure against a surge, a first connection conductor having one end connected to the first conductor and another end connected to the first component, a second component for a countermeasure against a surge, a second connection conductor having one end connected to the second conductor and another end connected to the second component, a ground layer, and a dielectric mounted between the line formation layer and the ground layer. Lengths of the first conductor and second conductor are adjusted based on a difference of capacitance values in the circuit board.

16 Claims, 10 Drawing Sheets

(58) Field of Classification Search
USPC .................................................. 361/111, 803
See application file for complete search history.

(56) References Cited

U.S. PATENT DOCUMENTS

2013/0114218 A1* 5/2013 Itagaki .................... H01P 5/028
                                                        361/748
2014/0085856 A1* 3/2014 Shirao ..................... H01P 5/028
                                                        361/803

OTHER PUBLICATIONS

Japanese Office Action for application No. 2017-560353 dated Feb. 27, 2018.
Chinese Office Action dated Mar. 3, 2022 issued in corresponding Chinese Application No. 201780091306.4 with an English Translation.

* cited by examiner

PRINTED CIRCUIT BOARD TO SUPPRESS DETERIORATION OF AN ELECTRICAL BALANCE IN A DIFFERENTIAL LINE

TECHNICAL FIELD

The present invention relates to a printed circuit board having a line formation layer in which a differential line is formed, and a ground layer.

BACKGROUND ART

A differential line formed in a line formation layer of a printed circuit board has a first conductor and a second conductor.

When transmitting signals using a printed circuit board, the apparatus on the signal transmission side may allow a signal to be propagated through the first conductor and a signal to be propagated through the second conductor, on the differential line, to be differential signals having the same amplitude and opposite phases.

In this case, the apparatus on the signal receiving side obtains the difference between the signal propagated through the first conductor and the signal propagated through the second conductor to thereby allow the voltage amplitude per conductor to be reduced.

Further, since the signal to be propagated through the first conductor and the signal to be propagated through the second conductor are differential signals having the same amplitude and opposite phases, noise radiated from the first conductor and noise radiated from the second conductor are canceled out. Therefore, radiation noise from the differential line is suppressed.

Also, the apparatus on the signal receiving side can cancel the influence of noise received from the outside by taking the difference between the signal propagated through the first conductor and the signal propagated through the second conductor.

However, when the symmetry of the line structure in the differential line is broken and the electrical balance of the differential line is deteriorated, common mode noise is propagated on the differential line. For this reason, the radiation noise from the differential line increases, and the noise resistance of the differential line decreases.

Therefore, it is necessary to design the line on the board in such a manner that the symmetry of the line structure in the differential line is not lost.

Patent Literature 1 mentioned below discloses a printed circuit board in which a differential line is designed in such a manner that the symmetry of the line structure is not lost.

The printed circuit board has a line formation layer in which a differential line is formed, and a ground layer.

The line formation layer is provided with first and second components for countermeasures against a surge to suppress a surge, and the first component is connected to a first conductor on the differential line by a first connection conductor, and the second component is connected to a second conductor on the differential line by a second connection conductor.

Therefore, first capacitance exists between the first connection conductor as well as the first component and the ground layer, and second capacitance exists between the second connection conductor as well as the second component and the ground layer.

In the printed circuit board, a first metal pattern and a second metal pattern are provided inside the dielectric mounted between the line formation layer and the ground layer in order to improve the electrical balance of the differential line by adjusting the difference between the first capacitance and the second capacitance.

CITATION LIST

Patent Literatures

Patent Literature 1: JP 2015-35468 A

SUMMARY OF INVENTION

Technical Problem

Since a conventional printed circuit board is configured as described above, the electrical balance of the differential line can be improved when first and second metal patterns capable of eliminating the difference between the first capacitance and the second capacitance can be provided. However, for example, when there is a demand for reduction in the number of board layers or a demand for high-density mounting of boards, constraints on installation of metal patterns, such as a layer on which the first and second metal patterns are provided and the size of the first and second metal patterns, may be placed. For this reason, there is a problem that a metal pattern that enables the difference between the first capacitance and the second capacitance to be kept within the range of the design target cannot be provided, so that the electrical balance of the differential line may be deteriorated.

The present invention has been made to solve the problem as described above. It is an object of the present invention to provide a printed circuit board capable of suppressing deterioration of the electrical balance of the differential line even in the case where a metal pattern that can keep the difference between first capacitance and second capacitance within the range of the design target cannot be provided.

Solution to Problem

A printed circuit board according to the present invention includes a line formation layer including a differential line having a first conductor and a second conductor, a first component. that is a component for a countermeasure against a surge, a first connection conductor having one end connected to the first conductor and another end connected to the first component, a. second component that is a component for a countermeasure against a surge, and a second connection conductor having one end connected to the second conductor and another end connected to the second component; a ground layer; and a dielectric mounted between the line formation layer and the ground layer. A first capacitance exists between the first connection conductor as well as the first component and the ground layer, and a second capacitance that has a capacitance value different from that of the first capacitance exists between the second connection conductor as well as the second component and the ground layer. The length of the first conductor and the length of the second conductor are adjusted so that the length of the first conductor is shorter than or longer than the length of the second conductor, depending on the difference in capacitance value between the first capacitance and the second capacitance.

Advantageous Effects of Invention

According to the present invention, it is so configured that the first capacitance exists between the first connection conductor as well as the first component and the ground layer, the second capacitance that has a capacitance value different from that of the first capacitance exists. between the second connection conductor as well as the second component and the ground layer, and the length of the first conductor and the length of the second conductor are adjusted so that the length of the first conductor is shorter than or longer than the length of the second conductor. depending on the difference in capacitance value between the first capacitance and the second capacitance. Therefore, even in the case where it is not possible to provide a nietal pattern that can allow the difference in capacitance value between the first capacitance and the second capacitance to be kept within the range of the desii target, an effect that deterioration of the balancing of the differential line can be suppressed is achieved.

DESCRIPTION OF EMBODIMENTS

Hereinafter, in order to explain the present invention in more detail, modes for carrying out the present invention will be described according to the accompanying drawings.

First Embodiment

FIG. 1 is a block diagram showing a printed circuit board according to a first embodiment of the present invention.

Figure 1A:
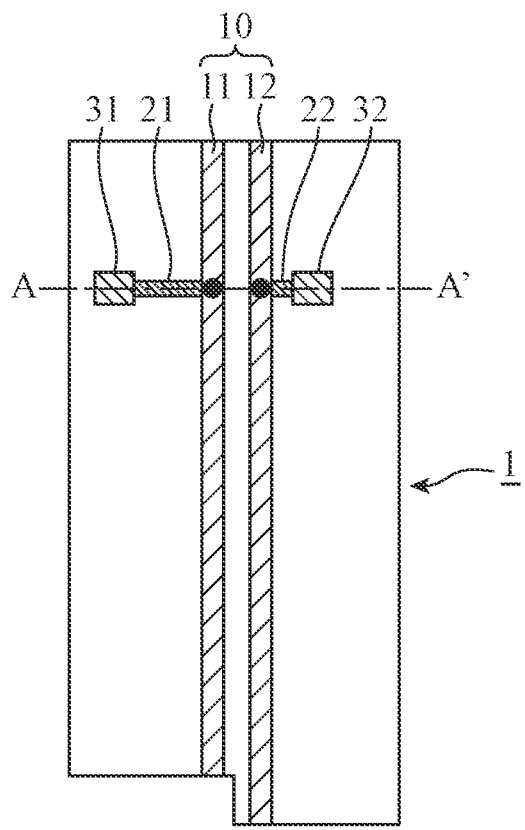
FIG. 1A is a schematic plan view showing a printed circuit board according to a first embodiment of the present invention.
Figure 1B:
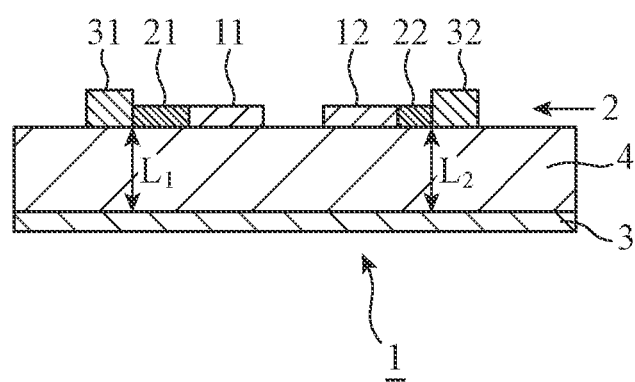
FIG. 1B is a schematic sectional view taken along line A-A' of the plan view of FIG. 1A.

FIG. 1A is a schematic plan view showing a printed circuit board according to the first embodiment of the present invention, and FIG. 1B is a schematic sectional view taken along line A-A' of the plan view of FIG. 1A.

In FIG. 1, a printed circuit board 1 includes a line formation layer 2 and a ground layer 3, and a dielectric 4 is mounted between the line formation layer 2 and the ground layer 3.

In the line formation layer 2, a differential line 10 having a first conductor 11 and a second conductor 12 is formed.

The line formation layer 2 also is formed to have a first connection conductor 21 whose one end is connected to the first conductor 11 of the differential line 10, and a first component 31 connected to the other end of the first connection conductor 21.

The line formation layer 2 is also formed to have a second connection conductor 22 whose one end is connected to the second conductor 12 on the differential line 10, and a second component 32 connected to the other end of the second connection conductor 22.

Here, each of the first component 31 and the second component 32 is a component for countermeasures against a surge, and is a component that suppresses a surge or static electricity, for example. As a component for countermeasures against a surge, an arrester, a varistor, a diode or the like can be considered.

In the example of FIG. 1, while the first component 31 and the second component 32 are symmetrically disposed at positions adjacent to the differential line 10 so as to sandwich the differential line 10, the first component 31 and the second component 32 may be disposed asymmetrically.

In the example of FIG. 1, first capacitance $C_1$ exists between the first connection conductor 21 as well as the first component 31 and the ground layer 3, and second capacitance $C_2$ exists between the second connection conductor 22 as well as the second component 32 and the ground layer 3.

A difference $\Delta C$ between the first capacitance $C_1$ and the second capacitance $C_2$ causes deterioration of electrical balance of the differential line 10.

Therefore, it is desirable that the difference $\Delta C$ between the first capacitance $C_1$ and the second capacitance $C_2$ be kept within the range of the design target.

The design target of the difference $\Delta C$ is set as described below, for example.

First, in a device on which the printed circuit board 1 is mounted, allowable radiation noise that is radiation noise permitted on the basis of legal regulations, voluntary standards, requirements of the device, and the like is determined.

Next, in consideration of various conditions such as the noise radiation efficiency from the printed circuit board 1 or the structure of the housing in which the printed circuit board 1 is accommodated, a design target of the difference $\Delta C$ is set so that the noise radiated from the printed circuit board is suppressed within the allowable radiation noise previously determined.

Each of the first capacitance $C_1$ and the second capacitance $C_2$ can be obtained by a calculation formula for parallel plate capacitance.

Therefore, the first capacitance $C_1$ is proportional to the mounting area of the first connection conductor 21 and the mounting area of the first component 31 in the line formation layer 2 and also proportional to the dielectric constant of the dielectric 4, and is inversely proportional to a distance $L_1$ from the first connection conductor 21 and the first component 31 to the ground layer 3.

Similarly, the second capacitance $C_2$ is proportional to the mounting area of the second connection conductor 22 and the mounting area of the second component 32 in the line formation layer 2, and proportional to the dielectric constant of the dielectric 4, and is inversely proportional to a distance $L_2$ from the second connection conductor 22 and the second component 32 to the ground layer 3.

In the case of the printed circuit board 1 of FIG. 1, the distance $L_1$ from the first connection conductor 21 and the first component 31 to the ground layer 3 and the distance $L_2$ from the second connection conductor 22 and the second component 32 to the ground layer 3 are equal. Also, the dielectric constant of the dielectric 4 between the first connection conductor 21 as well as the first component 31, and the ground layer 3, and the dielectric constant of the dielectric 4 between the second connection conductor 22 as well as the second component 32 and the ground layer 3, are equal.

Therefore, in the comparison between the first capacitance $C_1$ and the second capacitance $C_2$, the first capacitance $C_1$ is proportional to the total area of the mounting area of the first connection conductor 21 and the mounting area of the first component 31 in the line formation layer 2. Further, the second capacitance $C_2$ is proportional to the total area of the mounting area of the second connection conductor 22 and the mounting area of the second component 32 in the line formation layer 2.

Therefore, when the difference between the total area of the mounting area of the first connection conductor 21 and the mounting area of the first component 31 and the total area of the mounting area of the second connection conductor 22 and the mounting area of the second component 32 can be equal to or smaller than the predetermined value, the difference $\Delta C$ between the first capacitance $C_1$ and the second capacitance $C_2$ can be kept within the range of the design target.

However, due to various limitations caused by the recent demand for high-density board mounting, the difference between the total area of the mounting area of the first connection conductor 21 and the mounting area of the first component 31 and the total area of the mounting area of the second connection conductor 22 and the mounting area of the second component 32 cannot be equal to or smaller than the predetermined value in some cases.

In such a case, since the difference $\Delta C$ between the first capacitance $C_1$ and the second capacitance $C_2$ cannot be kept within the range of the design target, the electrical balance of the differential line 10 may be degraded.

In the first embodiment, when the difference $\Delta C$ between the first capacitance $C_1$ and the second capacitance $C_2$ cannot be kept within the range of the design target, the length of the first conductor 11 and the length of the second conductor 12 on the differential line 10 are each adjusted depending on the difference $\Delta C$.

For example, as shown in FIG. 1, when the total area of the mounting area of the first connection conductor 21 and the mounting area of the first component 31 in the line formation layer 2 is larger than the total area of the mounting area of the second connection conductor 22 and the mounting area of the second component 32, the length of the second conductor 12 is adjusted to be longer than the length of the first conductor 11.

When the total area of the mounting area of the first connection conductor 21 and the mounting area of the first component 31 in the line formation layer 2 is smaller than the total area of the mounting area of the second connection conductor 22 and the mounting area of the second component 32, the length of the first conductor 11 is adjusted to be longer than the length of the second conductor 12.

Here, the example shows the case where when the difference $\Delta C$ between the first capacitance $C_1$ and the second capacitance $C_2$ is not kept within the range of the design target, the length of the first conductor 11 and the length of the second conductor 12 on the differential line 10 are each adjusted, whereby deterioration of the electrical balance is suppressed.

With adjustment of the mounting area of the first connection conductor 21 in the line formation layer 2, the first capacitance $C_1$ can be changed, and with adjustment of the mounting area of the second connection conductor 22 in the line formation layer 2, the second capacitance $C_2$ can be changed.

For example, when the mounting area of the first connection conductor 21 is increased, the first capacitance $C_1$ is increased, and when the mounting area of the first connection conductor 21 is decreased, the first capacitance $C_1$ is decreased.

Further, when the mounting area of the second connection conductor 22 is increased, the second capacitance $C_2$ is increased, and when the mounting area of the second connection conductor 22 is decreased, the second capacitance $C_2$ is decreased.

Therefore, the mounting area of the first connection conductor 21 and the mounting area of the second connection conductor 22 each may be adjusted, along with adjustment of the length of the first conductor 11 and the length of the second conductor 12.

FIG. 1 shows an example in which although the original length of the first conductor 11 and the original length of the second conductor 12 on the differential line 10 are equal, the lengths are adjusted depending on the difference $\Delta C$ between the first capacitance $C_1$ and the second capacitance $C_2$ whereby the length of the first conductor 11 and the length of the second conductor 12 are unequal.

However, this is merely an example. The original length of the first conductor 11 and the original length of the second conductor 12 may be unequal.

Figure 2A:
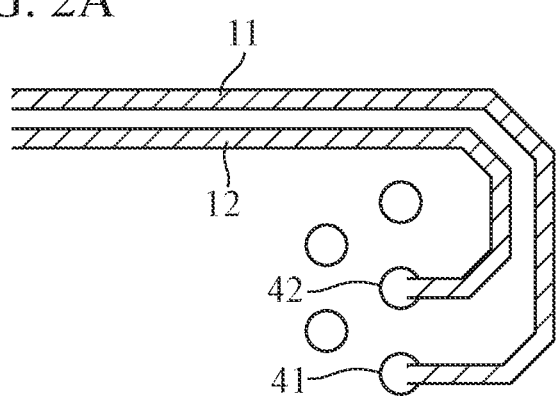
FIG. 2A is an explanatory view showing an example in which the original length of a first conductor 11 and the original length of a second conductor 12 are unequal.

FIG. 2A is an explanatory view showing an example in which the original length of the first conductor 11 and the original length of the second conductor 12 are unequal.

In the example of FIG. 2A, the first conductor 11 is connected to a connector 41, the second conductor 12 is connected to a connector 42, and the positions of the connector 41 and the connector 42 are different. Therefore, the length of the first conductor 11 is longer than the length of the second conductor 12.

Even when the length of the first conductor 11 and the length of the second conductor 12 are unequal, by adjusting the length of the first conductor 11 and the length of the second conductor 12 each depending on the difference $\Delta C$ between the first capacitance $C_1$ and the second capacitance $C_2$, it is possible to suppress deterioration of the electrical balance of the differential line 10.

The deterioration of the electrical balance of the differential line 10 can also be suppressed by adjusting the mounting area of the first connection conductor 21 and the mounting area of the second connection conductor 22 each.

Figure 2B:
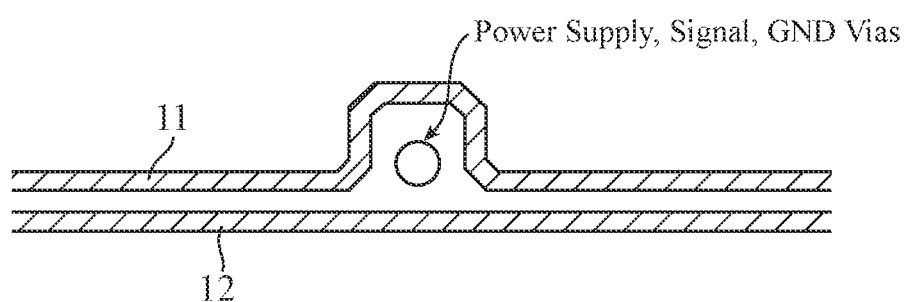
FIG. 2B is an explanatory view showing an example in which the length of the first conductor 11 and the length of the second conductor 12 are unequal in order to circumvent a power supply, GND, or other signal vias on the board.

FIG. 2B is an explanatory view showing an example in which the length of the first conductor 11 and the length of the second conductor 12 are unequal in order to circumvent the power supply, GND, or other signal vias on the board.

Even when the length of the first conductor 11 and the length of the second conductor 12 are unequal, by adjusting the length of the first conductor 11 and the length of the second conductor 12 each depending on the difference $\Delta C$ between the first capacitance $C_1$ and the second capacitance $C_2$, it is possible to suppress deterioration of the electrical balance of the differential line 10.

The deterioration of the electrical balance of the differential line 10 can also be suppressed by adjusting the mounting area of the first connection conductor 21 and the mounting area of the second connection conductor 22 each.

As is apparent from the above, according to the first embodiment, since it is so configured that the first capacitance $C_1$ exists between the first connection conductor 21 as well as the first component 31 and the ground layer 3, that the second capacitance $C_2$ exists between the second connection conductor 22 as well as the second component 32 and the ground layer 3, and that the length of the first conductor 11 and the length of the second conductor 12 are each adjusted depending on the difference $\Delta C$ between the first capacitance $C_1$ and the second capacitance $C_2$, even in the case where it is not possible to provide a metal pattern that can allow the difference $\Delta C$ between the first capacitance $C_1$ and the second capacitance $C_2$ to be kept within the range of the design target, an effect of suppressing deterioration of the electrical balance of the differential line 10 is achieved.

Thereby, common mode noise on the differential line 10 can be suppressed, radiation noise from the differential line 10 can be suppressed, and noise resistance of the differential line 10 can be improved.

In the first embodiment, an example in which the printed circuit board 1 has the line formation layer 2 and the ground layer 3 is shown. However, the printed circuit board 1 may have a multilayered structure including layers other than the line formation layer 2 and the ground layer 3.

In the first embodiment, an example in which the first component 31 and the second component 32 are formed in the line formation layer 2 is shown. However, it is also possible to have the printed circuit board 1 in which components other than the first component 31 and the second component 32 are formed on the line formation layer 2. Also, the number and the type of the components connected to the first conductor 11 may be different from the number and the type of the components connected to the second conductor 12.

Second Embodiment

In a second embodiment, an example in which each of a first metal pattern 51 and a second metal pattern 53 is disposed inside the dielectric 4 will be described.

However, even when the first metal pattern 51 and the second metal pattern 53 are disposed, deterioration of the electrical balance of the differential line 10 cannot be suppressed only by the metal patterns. Therefore, even in the second embodiment, it is not essential to dispose metal patterns that can keep the difference $\Delta C$ between the first capacitance $C_1$ and the second capacitance $C_2$ within the range of the design target.

FIG. 3 is a block diagram showing a printed circuit board according to the second embodiment of the present invention.

Figure 3A:
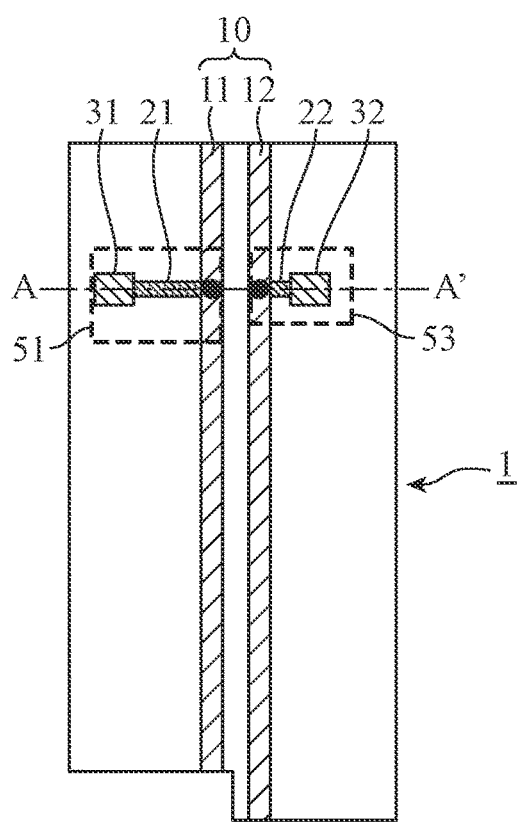
FIG. 3A is a schematic plan view showing a printed circuit board according to a second embodiment of the present invention.
Figure 3B:
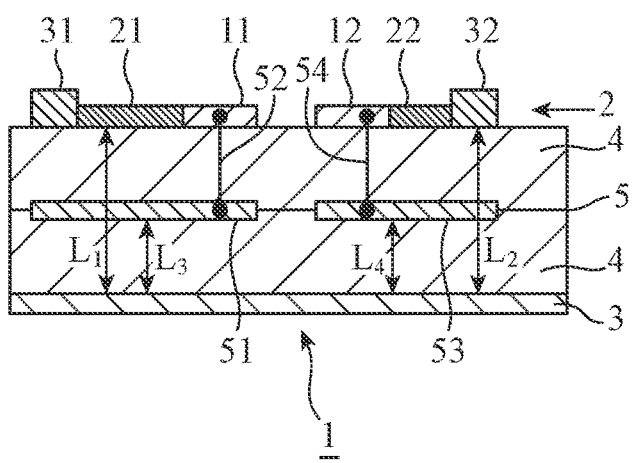
FIG. 3B is a schematic sectional view taken along line A-A' of the plan view of FIG. 3A.

FIG. 3A is a schematic plan view showing the printed circuit board according to the second embodiment of the present invention, and FIG. 3B is a schematic sectional view taken along line A-A' of the plan view of FIG. 3A.

In FIG. 3, since the same reference numerals as those in FIG. 1 denote identical or corresponding parts, the description thereof is omitted.

The first metal pattern 51 is disposed inside the dielectric 4 so as to be electrically connected to the first conductor 11 on the differential line 10.

A first via 52 is a connection member that electrically connects the first conductor 11 on the differential line 10 and the first metal pattern 51.

The first metal pattern 51 is disposed at a position including the whole of the first connection conductor 21 and the whole of the first component 31 when viewed from the line formation layer 2 toward the ground layer 3.

The second metal pattern 53 is disposed inside the dielectric 4 so as to be electrically connected to the second conductor 12 on the differential line 10.

A second via 54 is a connection member that electrically connects the second conductor 12 on the differential line 10 and the second metal pattern 53.

The second metal pattern 53 is disposed at a position including the whole of the second connection conductor 22 and the whole of the second component 32 when viewed in the direction from the line formation layer 2 toward the ground layer 3.

A metal pattern arranging layer 5 is a layer in which the first metal pattern 51 and the second metal pattern 53 are disposed, and is provided inside the dielectric 4.

When the first metal pattern 51 is disposed inside the dielectric 4 and the first metal pattern 51 is disposed at a position including the whole of the first connection conductor 21 and the whole of the first component 31, the first capacitance $C_1$ is a capacitance existing between the first metal pattern 51 and the ground layer 3.

Further, when the second metal pattern 53 is disposed inside the dielectric 4 and the second metal pattern 53 is disposed at a position including the whole of the second connection conductor 22 and the whole of the second component 32, the second capacitance $C_2$ is a capacitance existing between the second metal pattern 53 and the ground layer 3.

Each of the first capacitance $C_1$ and the second capacitance $C_2$ can be obtained by a calculation formula for parallel plate capacitance, as in the first embodiment.

Therefore, the first capacitance $C_1$ is proportional to the mounting area of the first metal pattern 51 in the metal pattern arranging layer 5 and also proportional to the dielectric constant of the dielectric 4, and is inversely proportional to a distance $L_3$ from the first metal pattern 51 to the ground layer 3.

Similarly, the second capacitance $C_2$ is proportional to the mounting area of the second metal pattern 53 in the metal pattern arranging layer 5 and also proportional to the dielectric constant of the dielectric 4, and is inversely proportional to a distance $L_4$ from the second metal pattern 53 to the ground layer 3.

In the case of the printed circuit board 1 of FIG. 3, the distance $L_3$ from the first metal pattern 51 to the ground layer 3 and the distance $L_4$ from the second metal pattern 53 to the ground layer 3 are equal. Further, the dielectric constant of the dielectric 4 between the first metal pattern 51 and the ground layer 3 and the dielectric constant of the dielectric 4 between the second metal pattern 53 and the ground layer 3 are equal.

Therefore, in the comparison between the first capacitance $C_1$ and the second capacitance $C_2$, the first capacitance $C_1$ is proportional to the mounting area of the first metal pattern 51 in the metal pattern arranging layer 5. Also, the second capacitance $C_2$ is proportional to the mounting area of the second metal pattern 53 in the metal pattern arranging layer 5.

Therefore, when the difference between the mounting area of the first metal pattern 51 in the metal pattern arranging layer 5 and the mounting area of the second metal pattern 53 in the metal pattern arranging layer 5 can be equal to or smaller than a predetermined value, the difference $\Delta C$ between the first capacitance $C_1$ and the second capacitance $C_2$ can be kept within the range of the design target.

However, due to various limitations caused by the recent demand for high-density board mounting, the difference between the mounting area of the first metal pattern 51 in the metal pattern arranging layer 5 and the mounting area of the second metal pattern 53 in the metal pattern arranging layer 5 cannot be equal to or smaller than a predetermined value in some cases.

In such a case, since the difference $\Delta C$ between the first capacitance $C_1$ and the second capacitance $C_2$ cannot be kept within the range of the design target, the electrical balance of the differential line 10 may be degraded.

In the second embodiment, when the difference $\Delta C$ between the first capacitance $C_1$ and the second capacitance $C_2$ cannot be kept within the range of the design target, the length of the first conductor 11 and the length of the second conductor 12 on the differential line 10 are each adjusted depending on the difference $\Delta C$.

For example, as shown in FIG. 3, when the mounting area of the first metal pattern 51 in the metal pattern arranging layer 5 is larger than the mounting area of the second metal pattern 53 in the metal pattern arranging layer 5, the length of the second conductor 12 is adjusted to be longer than the length of the first conductor 11.

When the mounting area of the first metal pattern 51 in the metal pattern arranging layer 5 is smaller than the mounting area of the second metal pattern 53 in the metal pattern arranging layer 5, the length of the first conductor 11 is adjusted to be longer than the length of the second conductor 12.

Here, the example shows the case where the length of the first conductor 11 and the length of the second conductor 12 on the differential line 10 are each adjusted so that the difference $\Delta C$ between the first capacitance $C_1$ and the second capacitance $C_2$ can be kept within the range of the design target.

With adjustment of the mounting area of the first metal pattern 51 in the metal pattern arranging layer 5, the first capacitance $C_1$ can be changed, and with adjustment of the mounting area of the second metal pattern 53 in the metal pattern arranging layer 5, the second capacitance $C_2$ can be changed.

For example, when the mounting area of the first metal pattern 51 is increased, the first capacitance $C_1$ is increased, and when the mounting area of the first metal pattern 51 is decreased, the first capacitance $C_1$ is decreased.

Further, when the mounting area of the second metal pattern 53 is increased, the second capacitance $C_2$ is increased, and when the mounting area of the second metal pattern 53 is decreased, the second capacitance $C_2$ is decreased.

Therefore, the mounting area of the first metal pattern 51 and the mounting area of the second metal pattern 53 each may be adjusted along with adjustment of the length of the first conductor 11 and the length of the second conductor 12.

FIG. 3 shows the example in which the first metal pattern 51 is disposed at a position including the whole of the first connection conductor 21 and the whole of the first component 31, and the second metal pattern 53 is disposed at a position including the whole of the second connection conductor 22 and the whole of the second component 32, when viewed from the line formation layer 2 toward the ground layer 3.

However, this is only an example. The first metal pattern 51 may be disposed at a position including a part of the first connection conductor 21 and the first component 31, when viewed from the line formation layer 2 toward the ground layer 3.

Further, the second metal pattern 53 may be disposed at a position including a part of the second connection conductor 22 and the second component 32.

When the first metal pattern 51 is disposed at a position including a part of the first connection conductor 21 and the first component 31, the first capacitance $C_1$ is a combined capacitance of the capacitance existing between the part not included in the first metal pattern 51, in the first connection conductor 21 and the first component 31, and the ground layer 3 and the capacitance between the first metal pattern 51 and the ground layer 3.

Further, when the second metal pattern 53 is disposed at a position including a part of the second connection conductor 22 and the second component 32, the second capacitance $C_2$ is a combined capacitance of the capacitance existing between the part not included in the second metal pattern 53, in the second connection conductor 22 and the second component 32, and the ground layer 3 and the capacitance existing between second metal pattern 53 and the ground layer 3.

Each of the first capacitance $C_1$ and the second capacitance $C_2$ can be obtained by a calculation formula for parallel plate capacitance, as in the first embodiment.

For this reason, the first capacitance $C_1$ is a combined capacitance of the capacitance that is proportional to the mounting area of the part not included in the first metal pattern 51 in the first connection conductor 21 and the first component 31 and proportional to the dielectric constant of the dielectric 4, and is inversely proportional to the distance $L_1$ from the first connection conductor 21 and the first component 31 to the ground layer 3, and the capacitance that is proportional to the mounting area of the first metal pattern 51 in the metal pattern arranging layer 5 and proportional to the dielectric constant of the dielectric 4, and is inversely proportional to the distance $L_3$ from the first metal pattern 51 to the ground layer 3.

Similarly, the second capacitance $C_2$ is a combined capacitance of the capacitance that is proportional to the mounting area of the part not included in the second metal pattern 53 in the second connection conductor 22 and the second component 32 and proportional to the dielectric constant of the dielectric 4, and is inversely proportional to the distance $L_2$ from the second connection conductor 22 and the second component 32 to the ground layer 3, and the capacitance that is proportional to the mounting area of the second metal pattern 53 in the metal pattern arranging layer 5 and proportional to the dielectric constant of the dielectric 4, and is inversely proportional to the distance $L_4$ from the second metal pattern 53 to the ground layer 3.

In the case of the printed circuit board 1 of FIG. 3, the distance $L_1$ from the first connection conductor 21 and the first component 31 to the ground layer 3 and the distance $L_2$ from the second connection conductor 22 and the second component 32 to the ground layer 3 are equal.

Further, the distance $L_3$ from the first metal pattern 51 to the ground layer 3 and the distance $L_4$ from the second metal pattern 53 to the ground layer 3 are equal.

The dielectric constant of the dielectric 4 between the first connection conductor 21 as well as the first component 31 and the ground layer 3, and the dielectric constant of the dielectric 4 between the second connection conductor 22 as well as the second component 32 and the ground layer 3, are equal.

For this reason, the first capacitance $C_1$ is the sum of term that is proportional to the mounting area of the part not included in the first metal pattern 51 in the first connection conductor 21 and the first component 31, and a term that is proportional to the mounting area of the first metal pattern 51 in the metal pattern arranging layer 5.

Further, the second capacitance $C_2$ is the sum of a term that is proportional to the mounting area of the part not included in the second metal pattern 53 in the second connection conductor 22 and the second component 32, and a term that is proportional to the mounting area of the second metal pattern 53 in the metal pattern arranging layer 5.

Therefore, when the following conditions A and B can be satisfied, the difference $\Delta C$ between the first capacitance $C_1$ and the second capacitance $C_2$ can be kept within the range of the design target.
(Condition A)

The difference between the mounting area of the part not included in the first metal pattern 51 in the first connection conductor 21 and the first component 31 and the mounting area of the part not included in the second metal pattern 53 in the second connection conductor 22 and the second component 32 is caused to be equal to or smaller than a predetermined value.
(Condition B)

The difference between the mounting area of the first metal pattern 51 in the metal pattern arranging layer 5 and the mounting area of the second metal pattern 53 in the metal pattern arranging layer 5 is caused to be equal to or smaller than a predetermined value.

However, there are cases where Condition A or Condition B cannot be satisfied due to various limitations caused by the recent demand for high-density board mounting.

In such a case, since the difference $\Delta C$ between the first capacitance $C_1$ and the second capacitance $C_2$ cannot be kept within the range of the design target, the electrical balance of the differential line 10 may be degraded.

In the second embodiment, when the difference $\Delta C$ between the first capacitance $C_1$ and the second capacitance $C_2$ cannot be kept within the range of the design target, the length of the first conductor 11 and the length of the second conductor 12 on the differential line 10 are each adjusted depending on the difference $\Delta C$.

Along with the adjustment of the length of the first conductor 11 and the length of the second conductor 12, the mounting area of the part not included in the first metal pattern 51, of the first connection conductor 21 and the first component 31, and the mounting area of the part not included in the second metal pattern 53, of the second connection conductor 22 and the second component 32, may be adjusted.

Alternatively, along with adjustment of the length of the first conductor 11 and the length of the second conductor 12, the mounting area of the first metal pattern 51 in the metal pattern arranging layer 5 and the mounting area of the second metal pattern 53 in the metal pattern arranging layer 5 each may be adjusted.

As is apparent from the above, according to the second embodiment, even when the first metal pattern 51 and the second metal pattern 53 are disposed inside the dielectric 4, an effect of suppressing deterioration of the electrical balance of the differential line 10 can be achieved, as in the first embodiment described above.

In the second embodiment, an example in which the first metal pattern 51 and the second metal pattern 53 are disposed in the same metal pattern arranging layer 5 is shown. However, as shown in FIGS. 4 and 5, the first metal pattern 51 and the second metal pattern 53 may be disposed in different metal pattern arranging layers.

FIG. 4 is a block diagram showing another printed circuit board according to the second embodiment of the present invention.

Figure 4A:
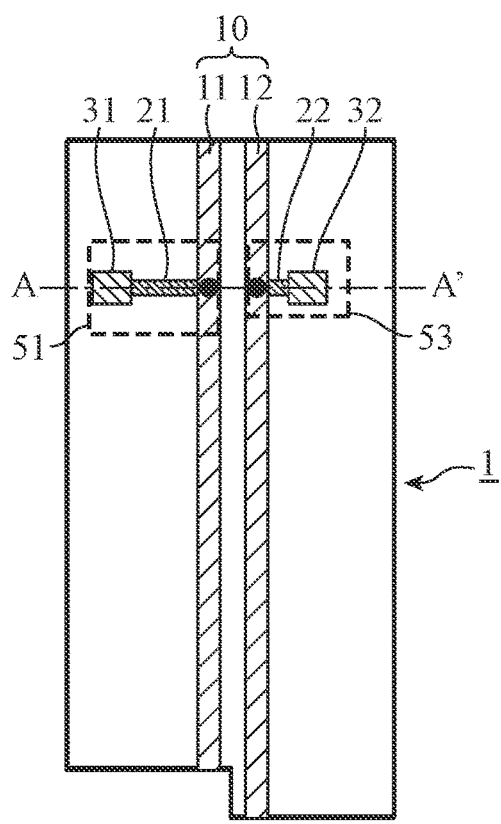
FIG. 4A is a schematic plan view showing another printed circuit board according to the second embodiment of the present invention.
Figure 4B:
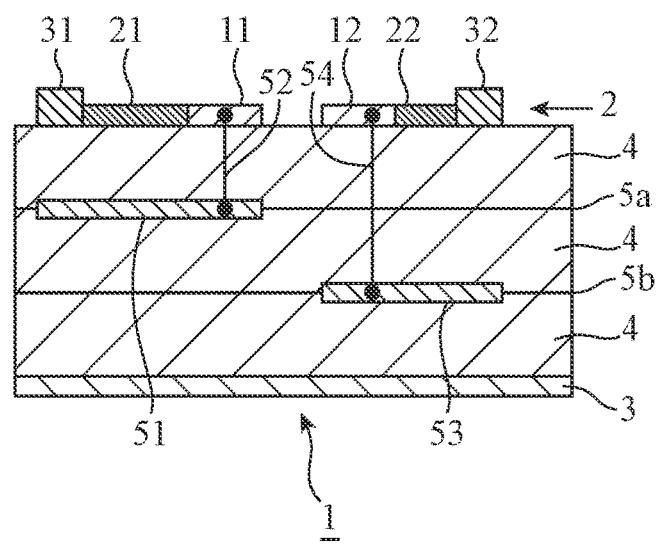
FIG. 4B is a schematic sectional view taken along line A-A' of the plan view of FIG. 4A.

FIG. 4A is a schematic plan view showing another printed circuit board according to the second embodiment of the present invention, and FIG. 4B is a schematic sectional view taken along line A-A' of the plan view of FIG. 4A.

In the example of FIG. 4, the first metal pattern 51 is disposed in a first metal pattern arranging layer 5a, and the second metal pattern 53 is disposed in a second metal pattern arranging layer 5b.

FIG. 5 is a block diagram showing another printed circuit board according to the second embodiment of the present invention.

Figure 5A:
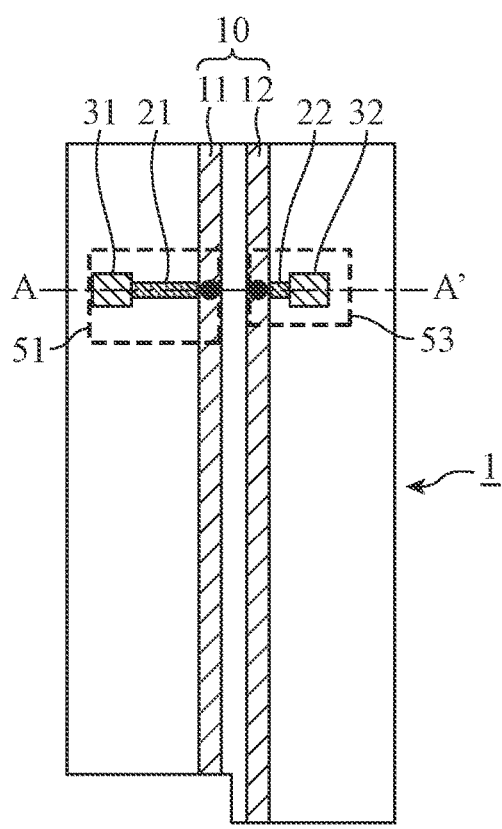
FIG. 5A is a schematic plan view showing another printed circuit board according to the second embodiment of the present invention.
Figure 5B:
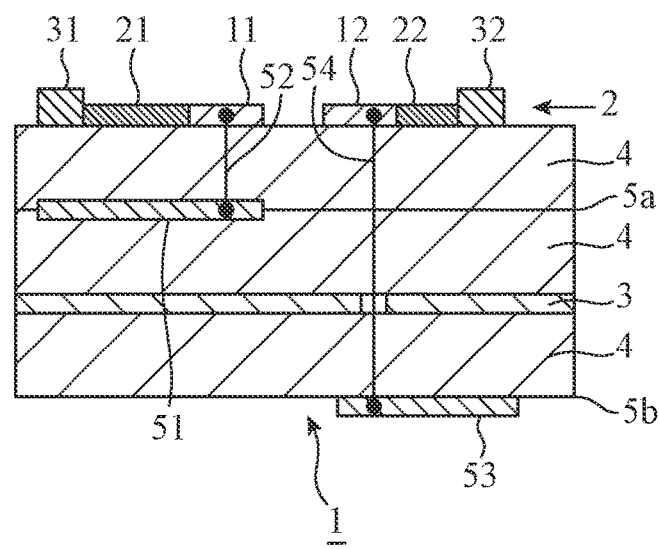
FIG. 5B is a schematic sectional view taken along line A-A' of the plan view of FIG. 5A.

FIG. 5A is a schematic plan view showing another printed circuit board according to the second embodiment of the present invention, and FIG. 5B is a schematic sectional view taken along line A-A' of the plan view of FIG. 5A.

In the example of FIG. 5, the first metal pattern 51 is disposed in the first metal pattern arranging layer 5a, and the second metal pattern 53 is disposed in the second metal pattern arranging layer 5b.

Further, in the example of FIG. 5, the ground layer 3 is disposed inside the dielectric 4, and the second metal pattern arranging layer 5b is disposed on a surface on which the line formation layer 2 is not formed, out of the two surfaces of the dielectric 4. That is, the second metal pattern arranging layer 5b is provided below the ground layer 3 in the drawing.

In the case of the printed circuit board shown in FIG. 5, the second capacitance $C_2$ is a combined capacitance of the capacitance existing between the second connection conductor 22 as well as the second component 32 and the ground layer 3, and the capacitance existing between the second metal pattern 53 and the ground layer 3.

Third Embodiment

In a third embodiment, as shown in FIG. 6, an example in which each of the first metal pattern 51 and the second metal pattern 53 disposed inside the dielectric 4 is connected to the ground layer 3 will be described.

Even in the third embodiment, deterioration of the electrical balance of the differential line 10 is not suppressed only by the metal pattern, as in the case of the second embodiment described above. Therefore, even in the third embodiment, it is not essential to dispose a metal pattern that can keep the difference ΔC between the first capacitance $C_1$ and the second capacitance $C_2$ within the range of the design target.

FIG. 6 is a block diagram showing a printed circuit board according to the third embodiment of the present invention.

Figure 6A:
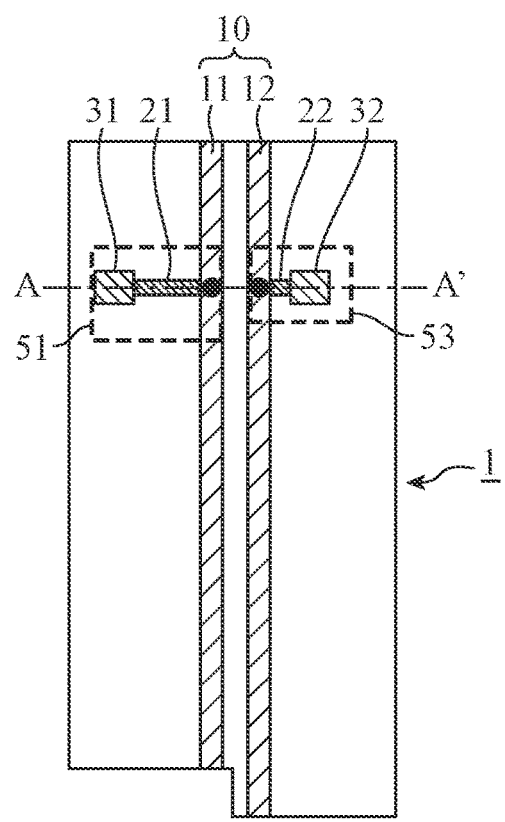
FIG. 6A is a schematic plan view showing a printed circuit board according to a third embodiment of the present invention.
Figure 6B:
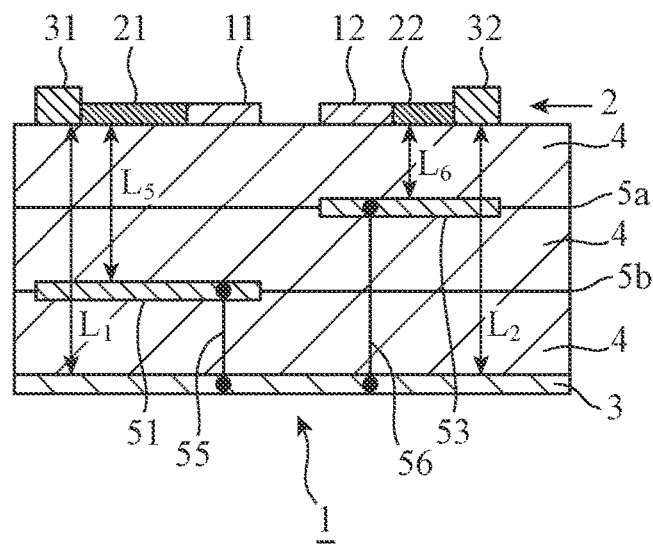
FIG. 6B is a schematic sectional view taken along line A-A' of the plan view of FIG. 6A.

FIG. 6A is a schematic plan view showing the printed circuit board according to the third embodiment of the present invention, and FIG. 6B is a schematic sectional view taken along line A-A' of the plan view of FIG. 6A.

In FIG. 6, since the same reference numerals as those in FIGS. 1 and 3 to 5 denote identical or corresponding parts, the description thereof is omitted.

The first metal pattern 51 is disposed at a position including the whole of the first connection conductor 21 and the whole of the first component 31 when viewed from the line formation layer 2 toward the ground layer 3.

A first via 55 is a connection member that electrically connects the ground layer 3 and the first metal pattern 51.

The second metal pattern 53 is disposed at a position including the whole of the second connection conductor 22 and the whole of the second component 32 when viewed in the direction from the line formation layer 2 toward the ground layer 3.

A second via 56 is a connection member that electrically connects the ground layer 3 and the second metal pattern 53.

When the first metal pattern 51 is disposed inside the dielectric 4 and the first metal pattern 51 is disposed at a position including the whole of the first connection conductor 21 and the whole of the first component 31, the first capacitance $C_1$ is a capacitance existing between the first connection conductor 21 as well as the first component 31 and the first metal pattern 51.

Further, when the second metal pattern 53 is disposed inside the dielectric 4 and the second metal pattern 53 is disposed at a position including the whole of the second connection conductor 22 and the whole of the second component 32, the second capacitance $C_2$ is a capacitance existing between the second connection conductor 22 as well as the second component 32 and the second metal pattern 53.

Each of the first capacitance $C_1$ and the second capacitance $C_2$ can be obtained by a calculation formula for parallel plate capacitance, as in the first embodiment.

Therefore, the first capacitance $C_1$ is proportional to the mounting area of the first connection conductor 21 and the mounting area of the first component 31 in the line formation layer 2 and proportional to the dielectric constant of the dielectric 4, and is inversely proportional to a distance $L_5$ from the first connection conductor 21 and the first component 31 to the first metal pattern 51.

Similarly, the second capacitance $C_2$ is proportional to the mounting area of the second connection conductor 22 and the mounting area of the second component 32 in the line formation layer 2 and proportional to the dielectric constant of the dielectric 4, and is inversely proportional to a distance $L_6$ from the second connection conductor 22 and the second component 32 to the second metal pattern 53.

In the case of the printed circuit board 1 of FIG. 6, the dielectric constant of the dielectric 4 between the first connection conductor 21 as well as the first component 31 and the first metal pattern 51, and the dielectric constant of the dielectric 4 between the second connection conductor 22 as well as the second component 32 and the second metal pattern 53 are equal.

Therefore, in the comparison between the first capacitance $C_1$ and the second capacitance $C_2$, the first capacitance $C_1$ is proportional to the total area of the mounting area of the first connection conductor 21 and the mounting area of the first component 31 in the line formation layer 2, and is inversely proportional to the distance $L_5$ from the first connection conductor 21 and the first component 31 to the first metal pattern 51.

The second capacitance $C_2$ is proportional to the total area of the mounting area of the second connection conductor 22 and the mounting area of the second component 32 in the line formation layer 2, and is inversely proportional to the distance $L_6$ from the second connection conductor 22 and the second component 32 to the second metal pattern 53.

Therefore, when the ratio of the total area of the mounting area of the first connection conductor 21 and the mounting area of the first component 31 to the distance $L_5$, and the ratio of the total area of the mounting area of the second connection conductor 22 and the mounting area of the second component 32 to the distance $L_6$ can be kept within a predetermined value, it is possible to keep the difference ΔC between the first capacitance $C_1$ and the second capacitance $C_2$ within the range of the design target.

However, due to various limitations caused by the recent demand for high-density board mounting, there are cases where the difference between the total area of the mounting area of the first connection conductor 21 and the mounting area of the first component 31 and the total area of the mounting area of the second connection conductor 22 and the mounting area of the second component 32 cannot be equal to or smaller than a predetermined value.

Also, there are cases where the difference between the distance $L_5$ and the distance $L_6$ cannot be equal to or smaller than a predetermined value.

In such a case, since the difference ΔC between the first capacitance $C_1$ and the second capacitance $C_2$ cannot be kept within the range of the design target, the electrical balance of the differential line 10 may be degraded.

In the third embodiment, when the difference ΔC between the first capacitance $C_1$ and the second capacitance $C_2$ cannot be kept within the range of the design target, the length of the first conductor 11 and the length of the second conductor 12 on the differential line 10 are each adjusted depending on the difference ΔC, as in the first and second embodiments.

Here, the example shows the case where when the difference ΔC between the first capacitance $C_1$ and the second capacitance $C_2$ cannot be kept within the design target range, the length of the first conductor 11 and the length of the second conductor 12 on the differential line 10 are each adjusted to thereby suppress deterioration of the electrical balance.

By adjusting the mounting area of the first metal pattern 51 in the second metal pattern arranging layer 5b, the first capacitance $C_1$ can be changed, and by adjusting the mounting area of the second metal pattern 53 in the first metal pattern arranging layer 5a, the second capacitance $C_2$ can be changed.

Therefore, the mounting area of the first metal pattern 51 and the mounting area of the second metal pattern 53 each may be adjusted along with adjustment of the length of the first conductor 11 and the length of the second conductor 12.

Further, along with the adjustment of the length of the first conductor 11 and the length of the second conductor 12, the distance $L_5$ from the first connection conductor 21 and the first component 31 to the first metal pattern 51 and the distance $L_6$ from the second connection conductor 22 and the second component 32 to the second metal pattern 53 each may be adjusted.

FIG. 6 shows the example in which the first metal pattern 51 is disposed at a position including the whole of the first connection conductor 21 and the whole of the first component 31, and the second metal pattern 53 is disposed at a position including the whole of the second connection conductor 22 and the whole of the second component 32, when viewed from the line formation layer 2 toward the ground layer 3.

However, this is only an example. The first metal pattern 51 may be disposed at a position including a part of the first connection conductor 21 and the first component 31, when viewed from the line formation layer 2 toward the ground layer 3.

Further, the second metal pattern 53 may be disposed at a position including a part of the second connection conductor 22 and the second component 32.

When the first metal pattern 51 is disposed at a position including a part of the first connection conductor 21 and the first component 31, the first capacitance $C_1$ is a combined capacitance of the capacitance existing between the part not included in the first metal pattern 51, of the first connection conductor 21 and the first component 31, and the ground layer 3, and the capacitance existing between the part included in the first metal pattern 51 and the first metal pattern 51.

Also, when the second metal pattern 53 is disposed at a position including a part of the second connection conductor 22 and the second component 32, the second capacitance $C_2$ is a combined capacitance of the capacitance existing between the part not included in the second metal pattern 53, of the second connection conductor 22 and the second component 32, and the ground layer 3, and the capacitance existing between the part included in the second metal pattern 53 and the second metal pattern 53.

Each of the first capacitance $C_1$ and the second capacitance $C_2$ can be obtained by a calculation formula for parallel plate capacitance, as in the first embodiment.

For this reason, the first capacitance $C_1$ is a combined capacitance of the capacitance that is proportional to the mounting area of the part not included in the first metal pattern 51, of the first connection conductor 21 and the first component 31, and proportional to the dielectric constant of the dielectric 4, and is inversely proportional to the distance $L_1$ from the first connection conductor 21 and the first component 31 to the ground layer 3, and the capacitance that is proportional to the mounting area of the part included in the first metal pattern 51, of the first connection conductor 21 and the first component 31, and proportional to the dielectric constant of the dielectric 4, and is inversely proportional to the distance $L_5$ from the first connection conductor 21 and the first component 31 to the first metal pattern 51.

Similarly, the second capacitance $C_2$ is a combined capacitance of the capacitance that is proportional to the mounting area of the part not included in the second metal pattern 53, of the second connection conductor 22 and the second component 32, and proportional to the dielectric constant of the dielectric 4, and is inversely proportional to the distance $L_2$ from the second connection conductor 22 and the second component 32 to the ground layer 3, and the capacitance that is proportional to the mounting area of the part included in the second metal pattern 52, of the second connection conductor 22 and the second component 32, and proportional to the dielectric constant of the dielectric 4, and is inversely proportional to the distance $L_6$ from the second connection conductor 22 and the second component 32 to the second metal pattern 53.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Along with the adjustment of the length of the first conductor 11 and the length of the second conductor 12, the mounting area of the part not included in the first metal pattern 51, of the first connection conductor 21 and the first component 31, and the mounting area of the part not included in the second metal pattern 53, of the second connection conductor 22 and the second component 32, may be adjusted.

Alternatively, along with the adjustment of the length of the first conductor 11 and the length of the second conductor 12, the mounting area of the first metal pattern 51 and the mounting area of the second metal pattern 53 each may be adjusted.

Alternatively, along with the adjustment of the length of the first conductor 11 and the length of the second conductor 12, the distance $L_5$ from the first connection conductor 21 and the first component 31 to the first metal pattern 51 and the distance $L_6$ from the second connection conductor 22 and the second component 32 to the second metal pattern 53 each may be adjusted.

As is apparent from the above, according to the third embodiment, even when the first metal pattern 51 and the second metal pattern 53 are disposed inside the dielectric 4, an effect that deterioration of the electrical balance of the differential line 10 can be suppressed is achieved, as in the first embodiment described above.

Fourth Embodiment

In a fourth embodiment, an example in which the first metal pattern 51 is electrically connected to the ground layer 3 and the second metal pattern 53 is electrically connected to the second conductor 12 on the differential line 10 will be described.

FIG. 7 is a block diagram showing a printed circuit board according to the fourth embodiment of the present invention.

Figure 7A:
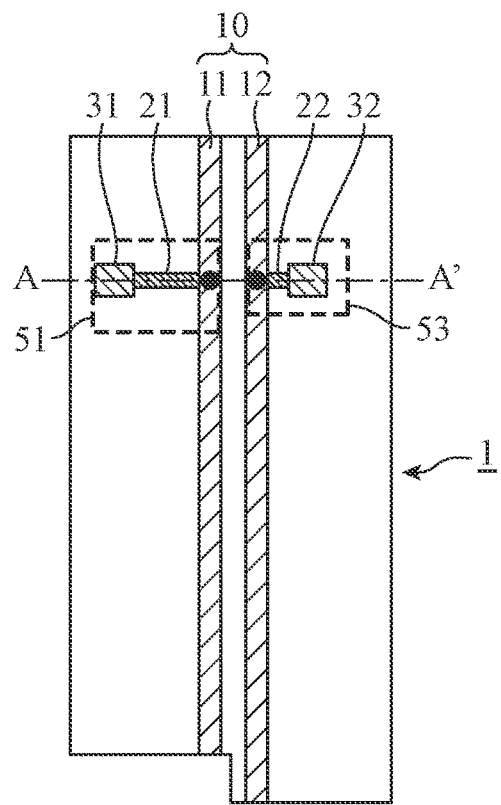
FIG. 7A is a schematic plan view showing a printed circuit board according to a fourth embodiment of the present invention.
Figure 7B:
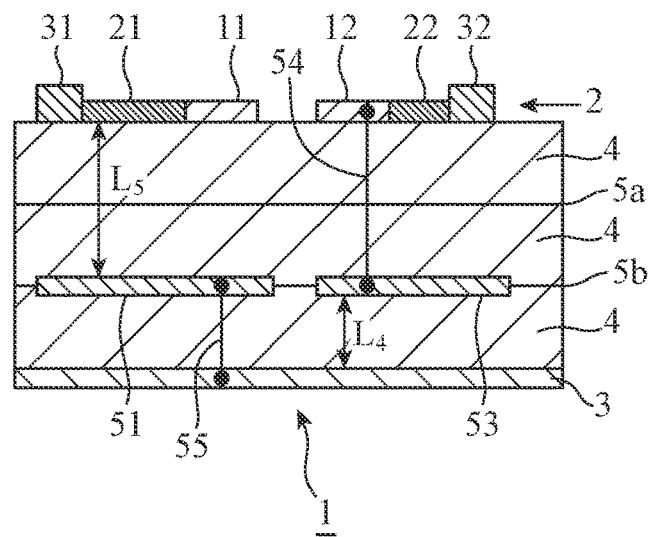
FIG. 7B is a schematic sectional view taken along line A-A' of the plan view of FIG. 7A.

FIG. 7A is a schematic plan view showing the printed circuit board according to the fourth embodiment of the present invention, and FIG. 7B is a schematic sectional view taken along line A-A' of the plan view of FIG. 7A.

In FIG. 7, the same reference numerals as those in FIGS. 1 and 3 to 6 denote identical or corresponding parts.

When the first metal pattern 51 is disposed inside the dielectric 4 and the first metal pattern 51 is disposed at a position including the whole of the first connection conductor 21 and the whole of the first component 31, the first capacitance $C_1$ exists between the first connection conductor 21 as well as the first component 31 and the first metal pattern 51.

Further, when the second metal pattern 53 is disposed inside the dielectric 4 and the second metal pattern 53 is disposed at a position including the whole of the second connection conductor 22 and the whole of the second component 32, the second capacitance $C_2$ exists between the second metal pattern 53 and the ground layer 3.

Each of the first capacitance $C_1$ and the second capacitance $C_2$ can be obtained by a calculation formula for parallel plate capacitance, as in the first embodiment.

Therefore, the first capacitance $C_1$ is proportional to the mounting area of the first connection conductor 21 and the mounting area of the first component 31 in the line formation layer 2 and proportional to the dielectric constant of the dielectric 4, and is inversely proportional to a distance $L_5$ from the first connection conductor 21 and the first component 31 to the first metal pattern 51.

The second capacitance $C_2$ is proportional to the mounting area of the second metal pattern 53 in the second metal pattern arranging layer 5b and proportional to the dielectric constant of the dielectric 4, and is inversely proportional to the distance $L_4$ from the second metal pattern 53 to the ground layer 3.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Alternatively, along with the adjustment of the length of the first conductor 11 and the length of the second conductor 12, the mounting area of the first connection conductor 21 and the mounting area of the first component 31 in the line formation layer 2 and the mounting area of the second metal pattern 53 in the second metal pattern arranging layer 5b may be adjusted.

Alternatively, along with the adjustment of the length of the first conductor 11 and the length of the second conductor 12, the distance $L_5$ from the first connection conductor 21 and the first component 31 to the first metal pattern 51 and the distance $L_4$ from the second metal pattern 53 to the ground layer 3 may be adjusted.

FIG. 7 shows the example in which the first metal pattern 51 is disposed at a position including the whole of the first connection conductor 21 and the whole of the first component 31, and the second metal pattern 53 is disposed at a position including the whole of the second connection conductor 22 and the whole of the second component 32, when viewed from the line formation layer 2 toward the ground layer 3.

However, this is only an example. The first metal pattern 51 may be disposed at a position including a part of the first connection conductor 21 and the first component 31, when viewed from the line formation layer 2 toward the ground layer 3.

Further, the second metal pattern 53 may be disposed at a position including a part of the second connection conductor 22 and the second component 32.

When the first metal pattern 51 is disposed at a position including a part of the first connection conductor 21 and the first component 31, the first capacitance $C_1$ is a combined capacitance of the capacitance existing between the part not included in the first metal pattern 51, of the first connection conductor 21 and the first component 31, and the ground layer 3, and the capacitance existing between the part included in the first metal pattern 51 and the first metal pattern 51.

Further, when the second metal pattern 53 is disposed at a position including a part of the second connection conductor 22 and the second component 32, the second capacitance $C_2$ is a combined capacitance of the capacitance existing between the part not included in the second metal pattern 53, in the second connection conductor 22 and the second component 32, and the ground layer 3 and the capacitance existing between second metal pattern 53 and the ground layer 3.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Along with the adjustment of the length of the first conductor 11 and the length of the second conductor 12, the mounting area of the part not included in the first metal pattern 51, of the first connection conductor 21 and the first component 31, and the mounting area of the part not included in the second metal pattern 53, of the second connection conductor 22 and the second component 32, may be adjusted.

Alternatively, along with the adjustment of the length of the first conductor 11 and the length of the second conductor 12, the mounting area of the first metal pattern 51 in the second metal pattern arranging layer 5b and the mounting area of the second metal pattern 53 in the second metal pattern arranging layer 5b may be adjusted.

Alternatively, along with the adjustment of the length of the first conductor 11 and the length of the second conductor 12, the distance $L_5$ from the first connection conductor 21 and the first component 31 to the first metal pattern 51 and the distance $L_4$ from the second metal pattern 53 to the ground layer 3 may be adjusted.

As is apparent from the above, according to the fourth embodiment, even in the case where the first metal pattern 51 is electrically connected to the ground layer 3, and the second metal pattern 53 is electrically connected to the second conductor 12 on the differential line 10, an effect that deterioration of the electrical balance of the differential line 10 can be suppressed is achieved, as in the first embodiment described above.

The fourth embodiment shows the example in which the first metal pattern 51 and the second metal pattern 53 are disposed in the second metal pattern arranging layer 5b. However, as shown in FIG. 8, the first metal pattern 51 and the second metal pattern 53 may be disposed in different metal pattern arranging layers.

FIG. 8 is a block diagram showing another printed circuit board according to the fourth embodiment of the present invention.

Figure 8A:
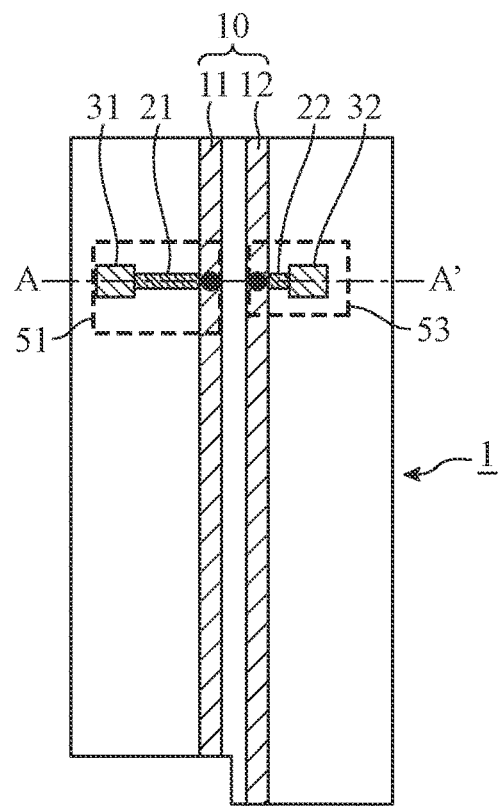
FIG. 8A is a schematic plan view showing another printed circuit board according to the fourth embodiment of the present invention.
Figure 8B:
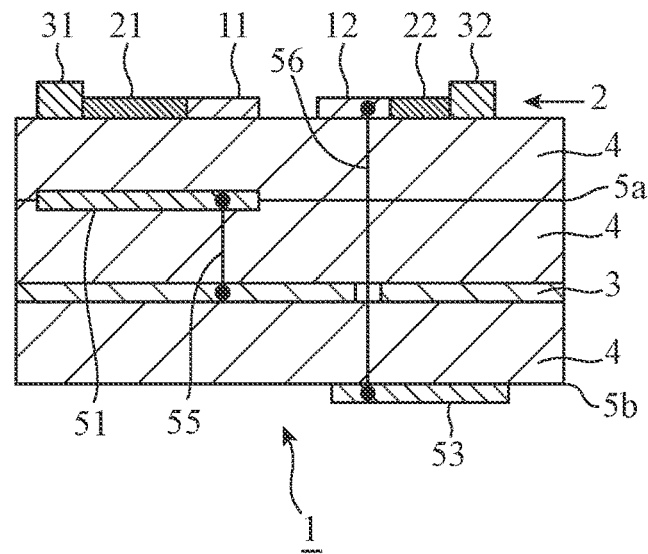
FIG. 8B is a schematic sectional view taken along line A-A' of the plan view of FIG. 8A.

FIG. 8A is a schematic plan view showing another printed circuit board according to the fourth embodiment of the present invention, and FIG. 8B is a schematic sectional view taken along line A-A' of the plan view of FIG. 8A.

In the example of FIG. 8, the first metal pattern 51 is disposed in the first metal pattern arranging layer 5a, and the second metal pattern 53 is disposed in the second metal pattern arranging layer 5b.

Further, in the example of FIG. 8, the ground layer 3 is disposed inside the dielectric 4, and the second metal pattern arranging layer 5b is disposed on a surface on which the line formation layer 2 is not formed, out of the two surfaces of the dielectric 4. That is, the second metal pattern arranging layer 5b is provided below the ground layer 3 in the drawing.

In the case of the printed circuit board shown in FIG. 8, the second capacitance $C_2$ is a combined capacitance of the capacitance existing between the second connection conductor 22 as well as the second component 32 and the ground layer 3, and the capacitance existing between the second metal pattern 53 and the ground layer 3.

Fifth Embodiment

In a fifth embodiment, an example in which a connection conductor forming layer 6 in which the component and the connection conductor are formed is provided separately from the line formation layer 2 in which the differential line 10 is formed will be described.

FIG. 9 is a block diagram showing a printed circuit board according to the fifth embodiment of the present invention.

Figure 9A:
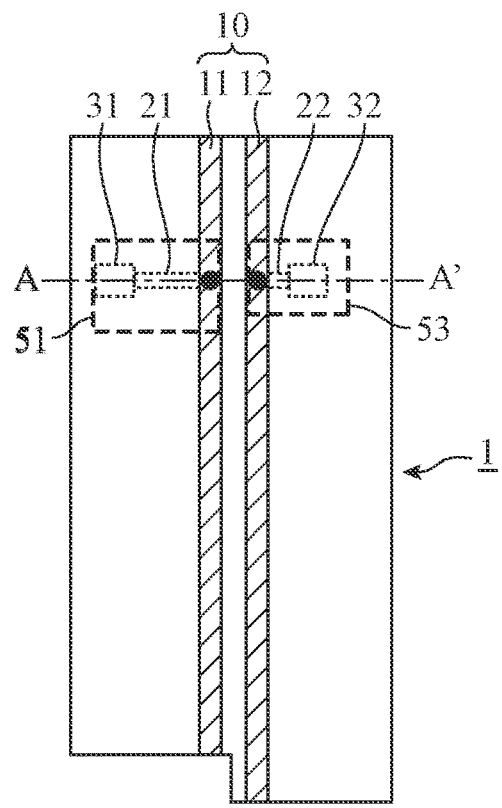
FIG. 9A is a schematic plan view showing circuit board according to a fifth embodiment of the present invention.
Figure 9B:
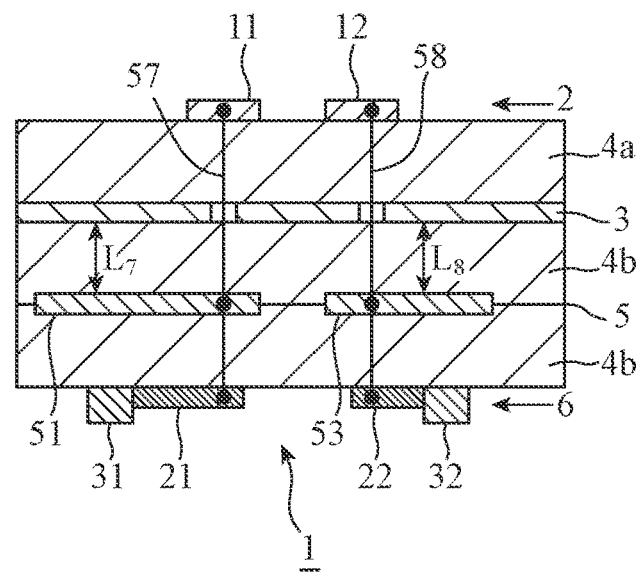
FIG. 9B is a schematic sectional view taken along line A-A' of the plan view of 9A.

FIG. 9A is a schematic plan view showing a printed circuit board according to the fifth embodiment of the present invention, and FIG. 9B is a schematic sectional view taken along line A-A' of the plan view of FIG. 9A.

In FIG. 9, since the same reference numerals as those in FIGS. 1 and 3 to 8 denote identical or corresponding parts, the description thereof is omitted.

In the connection conductor forming layer 6, the first component 31 that is a component for countermeasures against a surge, the first connection conductor 21 electrically connected to the first component 31, the second component 32 that is a component for countermeasures against a surge, and the second connection conductor 22 electrically connected to the second component 32 are formed.

A first dielectric 4a is mounted between the line formation layer 2 and the ground layer 3.

A second dielectric 4b is mounted between the ground layer 3 and the connection conductor forming layer 6.

A first via 57 is a connection member that electrically connects the first conductor 11 on the differential line 10, the first metal pattern 51, and the first connection conductor 21.

A second via 58 is a connection member that electrically connects the second conductor 12 on the differential line 10, the second metal pattern 53, and the second connection conductor 22.

When the first metal pattern 51 is disposed inside the second dielectric 4b and the first metal pattern 51 is disposed at a position including the whole of the first connection conductor 21 and the whole of the first component 31, the first capacitance $C_1$ is the capacitance existing between the first metal pattern 51 and the ground layer 3.

Further, when the second metal pattern 53 is disposed inside the second dielectric 4b and the second metal pattern 53 is disposed at a position including the whole of the second connection conductor 22 and the whole of the second component 32, the second capacitance $C_2$ is a capacitance existing between the second metal pattern 53 and the ground layer 3.

Each of the first capacitance $C_1$ and the second capacitance $C_2$ can be obtained by a calculation formula for parallel plate capacitance, as in the first embodiment.

Therefore, the first capacitance $C_1$ is proportional to the mounting area of the first metal pattern 51 in the metal pattern arranging layer 5 and also proportional to the dielectric constant of the second dielectric 4b, and is inversely proportional to a distance $L_7$ from the first metal pattern 51 to the ground layer 3.

Similarly, the second capacitance $C_2$ is proportional to the mounting area of the second metal pattern 53 in the metal pattern arranging layer 5 and also proportional to the dielectric constant of the second dielectric 4b, and is inversely proportional to a distance $L_8$ (=$L_7$) from the second metal pattern 53 to the ground layer 3.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Also, along with the adjustment of the length of the first conductor 11 and the length of the second conductor 12, the mounting area of the first metal pattern 51 and the mounting area of the second metal pattern 53 in the metal pattern arranging layer 5 are each adjusted.

FIG. 9 shows an example in which the first metal pattern 51 is disposed at a position including the whole of the first connection conductor 21 and the whole of the first component 31, and the second metal pattern 53 is disposed at a position including the whole of the second connection conductor 22 and the whole of the second component 32, when viewed from the line formation layer 2 to the ground layer 3.

However, this is only an example. The first metal pattern 51 may be disposed at a position including a part of the first connection conductor 21 and the first component 31, when viewed from the line formation layer 2 toward the ground layer 3.

Further, the second metal pattern 53 may be disposed at a position including a part of the second connection conductor 22 and the second component 32.

When the first metal pattern 51 is disposed at a position including a part of the first connection conductor 21 and the first component 31, the first capacitance $C_1$ is a combined capacitance of the capacitance existing between the part not included in the first metal pattern 51, in the first connection conductor 21 and the first component 31, and the ground layer 3 and the capacitance between the first metal pattern 51 and the ground layer 3.

Further, when the second metal pattern 53 is disposed at a position including a part of the second connection conductor 22 and the second component 32, the second capacitance $C_2$ is a combined capacitance of the capacitance existing between the part not included in the second metal pattern 53, in the second connection conductor 22 and the second component 32, and the ground layer 3 and the capacitance existing between the second metal pattern 53 and the ground layer 3.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Along with the adjustment of the length of the first conductor 11 and the length of the second conductor 12, the mounting area of the part not included in the first metal pattern 51, of the first connection conductor 21 and the first component 31, and the mounting area of the part not included in the second metal pattern 53, of the second connection conductor 22 and the second component 32, may be adjusted.

Alternatively, along with the adjustment of the length of the first conductor 11 and the length of the second conductor 12, the mounting area of the first metal pattern 51 and the mounting area of the second metal pattern 53 in the metal pattern arranging layer 5 may be adjusted.

As is apparent from the above, according to the fifth embodiment, the connection conductor forming layer 6 in which the component and the connection conductor are formed is provided separately from the line formation layer 2 in which the differential line 10 is formed. Even in this case, an effect that deterioration of the electrical balance of the differential line 10 can be suppressed is achieved, as in the first embodiment described above.

Sixth Embodiment

In a sixth embodiment, an example in which dielectric constants c of the dielectrics mounted between the line formation layer 2 and the ground layer 3 are partially different will be described.

FIG. 10 is a block diagram showing a printed circuit board according to the sixth embodiment of the present invention.

Figure 10A:
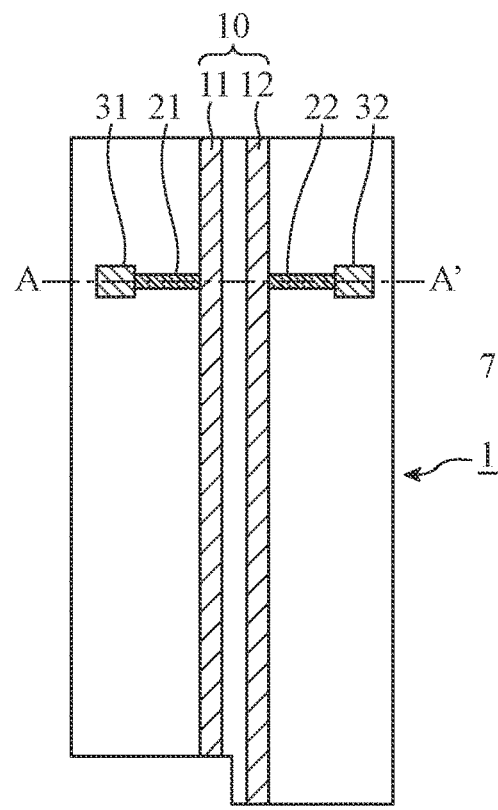
FIG. 10A is a schematic plan view showing a printed circuit board according to a sixth embodiment of the present invention.
Figure 10B:
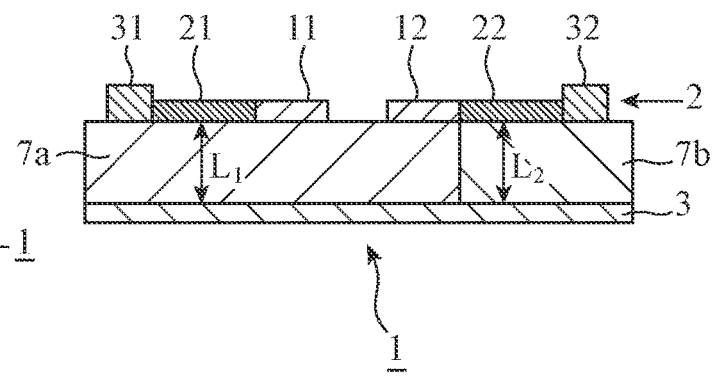
FIG. 10B is a schematic sectional view taken along line A-A' of the plan view of FIG. 10A.

FIG. 10A is a schematic plan view showing a printed circuit board according to the sixth embodiment of the present invention, and FIG. 10B is a schematic sectional view taken along line A-A' of the plan view of FIG. 10A.

In FIG. 10, since the same reference numerals as those in FIG. 1 denote identical or corresponding parts, the description thereof is omitted.

A dielectric 7a is mounted between the first connection conductor 21 as well as the first component 31 and the ground layer 3, and is a dielectric having a dielectric constant of $\varepsilon_1$.

A dielectric 7b is mounted between the second connection conductor 22 as well as the second component 32 and the ground layer 3, and is a dielectric having a dielectric constant of $\varepsilon_2$.

The first capacitance $C_1$ is proportional to the mounting area of the first connection conductor 21 and the mounting area of the first component 31 in the line formation layer 2, and proportional to the dielectric constant $\varepsilon_1$ of the dielectric 7a, and is inversely proportional to the distance $L_1$ from the first connection conductor 21 and the first component 31 to the ground layer 3.

Similarly, the second capacitance $C_2$ is proportional to the mounting area of the second connection conductor 22 and the mounting area of the second component 32 in the line formation layer 2, and proportional to the dielectric constant $\varepsilon_2$ of the dielectric 7b, and is inversely proportional to the distance $L_2$ ($=L_1$) from the second connection conductor 22 and the second component 32 to the ground layer 3.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Also, along with the adjustment of the length of the first conductor 11 and the length of the second conductor 12, the mounting area of the first connection conductor 21 and the mounting area of the second connection conductor 22 in the line formation layer 2 each may be adjusted.

Alternatively, along with the adjustment of the length of the first conductor 11 and the length of the second conductor 12, the dielectric constant $\varepsilon_1$ of the dielectric 7a and the dielectric constant $\varepsilon_2$ of the dielectric 7b each may be adjusted.

As is apparent from the above, according to the sixth embodiment, it is configured that the dielectric constant $\varepsilon_1$ of the dielectric 7a mounted between the first connection conductor 21 as well as the first component 31 and the ground layer 3, and the dielectric constant $\varepsilon_2$ of the dielectric 7b mounted between the second connection conductor 22 as well as the second component 32 and the ground layer 3 are different. Therefore, an effect that deterioration of the electrical balance of the differential line 10 can be suppressed is achieved, as in the first embodiment described above.

Seventh Embodiment

In a seventh embodiment, an example in which a third conductor 60 electrically connected to either the first conductor 11 or the second conductor 12 on the differential line 10 is formed in the line formation layer 2 will be described.

FIG. 11 is a block diagram showing a printed circuit board according to the seventh embodiment of the present invention.

Figure 11A:
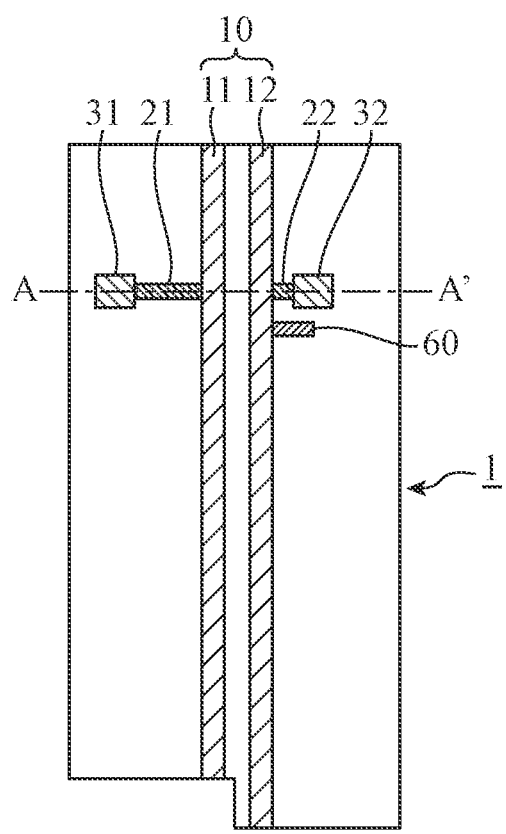
FIG. 11A is a schematic plan view showing a printed circuit board according to a seventh embodiment of the present invention.
Figure 11B:
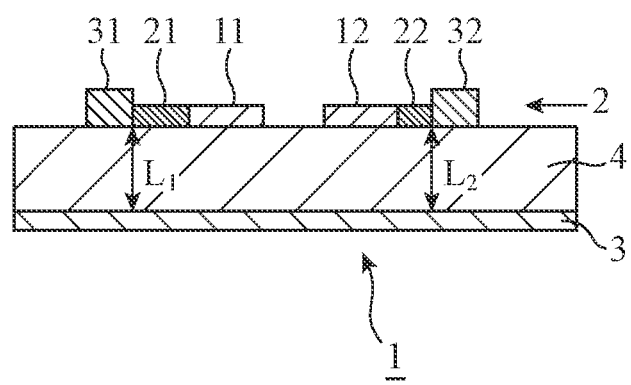
FIG. 11B is a schematic sectional view taken along line A-A' of the plan view of FIG. 11A.

FIG. 11A is a schematic plan view showing a printed circuit board according to the seventh embodiment of the present invention, and FIG. 11B is a schematic sectional view taken along line A-A' of the plan view of FIG. 11A.

In FIG. 11, since the same reference numerals as those in FIG. 1 denote identical or corresponding parts, the description thereof is omitted.

The third conductor 60 is a conductor whose one end is electrically connected to the second conductor 12 on the differential line 10, and the third conductor 60 is formed in the line formation layer 2.

Although FIG. 11 shows the example in which one end of the third conductor 60 is electrically connected to the second conductor 12, that one end of the third conductor 60 may be electrically connected to the first conductor 11.

The first capacitance $C_1$ is proportional to the mounting area of the first connection conductor 21 and the mounting area of the first component 31 in the line formation layer 2 and proportional to the dielectric constant of the dielectric 4, and is inversely proportional to the distance $L_1$ from the first connection conductor 21 and the first component 31 to the ground layer 3.

The second capacitance $C_2$ is proportional to the mounting area of the second connection conductor 22 and the mounting area of the second component 32 and the third conductor 60 in the line formation layer 2 and proportional to the dielectric constant of the dielectric 4, and is inversely proportional to the distance $L_2$ ($=L_1$) from the second connection conductor 22 and the second component 32 to the ground layer 3.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Also, along with the adjustment of the length of the first conductor 11 and the length of the second conductor 12, the mounting area of the first connection conductor 21 and the mounting area of the second connection conductor 22 in the line formation layer 2 each may be adjusted.

Alternatively, the mounting area of the third conductor 60 in the line formation layer 2 may be adjusted.

As is apparent from the above, according to the seventh embodiment, an effect that deterioration of the electrical balance of the differential line 10 can be suppressed is achieved, as in the first embodiment described above.

Eighth Embodiment

In the first embodiment, an example in which the first component 31 and the second component 32 are disposed on the same plane as the first connection conductor 21 and the second connection conductor 22, is shown. However, the first component 31 may be stacked on the first connection conductor 21, and the second component 32 may be stacked on the second connection conductor 22.

FIG. 12 is a block diagram showing a printed circuit board according to an eighth embodiment of the present invention.

Figure 12A:
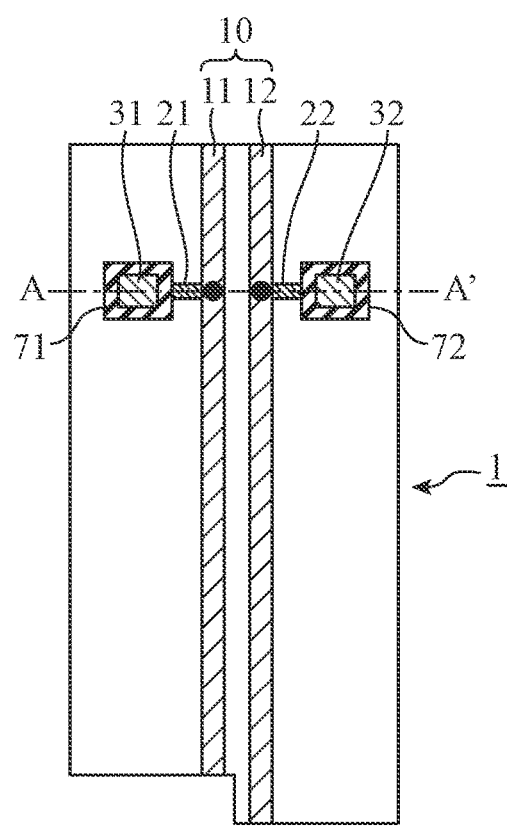
FIG. 12A is a schematic plan view showing a printed circuit board according to an eighth embodiment of the present invention.
Figure 12B:
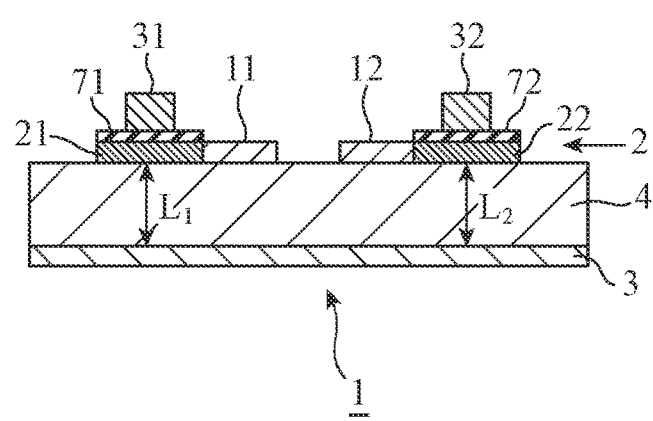
FIG. 12B is a schematic sectional view taken along line A-A' of the plan view of FIG. 12A.

FIG. 12A is a schematic plan view showing a printed circuit board according to the eighth embodiment of the present invention, and FIG. 12B is a schematic sectional view taken along line A-A' of the plan view of FIG. 12A.

In FIG. 12, since the same reference numerals as those in FIG. 1 denote identical or corresponding parts, the description thereof is omitted.

A first insulator 71 is disposed on the first connection conductor 21 in order to prevent a short circuit between the terminals of the first component 31.

The first component 31 is disposed on the first insulator 71, and a terminal on one side of the first component 31 is electrically connected to the first connection conductor 21.

A second insulator 72 is disposed on the second connection conductor 22 in order to prevent a short circuit between the terminals of the second component 32.

The second component 32 is disposed on the second insulator 72, and a terminal on one side of the second component 32 is electrically connected to the second connection conductor 22.

The first capacitance $C_1$ is proportional to the mounting area of the first connection conductor 21 in the line formation layer 2 and proportional to the dielectric constant of the dielectric 4, and is inversely proportional to the distance $L_1$ from the first connection conductor 21 to the ground layer 3.

The second capacitance $C_2$ is proportional to the mounting area of the second connection conductor 22 in the line formation layer 2 and proportional to the dielectric constant of the dielectric 4, and is inversely proportional to the distance $L_2$ ($=L_1$) from the second connection conductor 22 to the ground layer 3.

When the difference $\Delta C$ between the first capacitance $C_1$ and the second capacitance $C_2$ is not kept within the range of the design target, the length of the first conductor 11 and the length of the second conductor 12 on the differential line 10 are each adjusted depending on the difference $\Delta C$, as in the first embodiment described above.

Also, along with the adjustment of the length of the first conductor 11 and the length of the second conductor 12, the mounting area of the first connection conductor 21 and the mounting area of the second connection conductor 22 in the line formation layer 2 each may be adjusted.

As is apparent from the above, according to the eighth embodiment, an effect that deterioration of the electrical balance of the differential line 10 can be suppressed is achieved, as in the first embodiment.

The present invention of the present application allows free combination of respective embodiments, modification of any components of the respective embodiments, or omission of any components in the respective embodiments, within the scope of the invention.

INDUSTRIAL APPLICABILITY

The present invention is applicable to a printed circuit board having a line formation layer on which a differential line is formed and a ground layer.

REFERENCE SIGNS LIST

1: Printed circuit board, 2: Line formation layer, 3: Ground layer, 4: Dielectric, 4a: First dielectric, 4b: Second dielectric, 5: Metal pattern arranging layer, 5a: First metal pattern arranging layer, 5b: Second metal pattern arranging layer, 6: Connection conductor forming layer, 7a, 7b: Dielectric, 10: Differential line, 11: First conductor, 12: Second conductor, 21: First connection conductor, 22: Second connection conductor, 31: First component, 32: Second component, 41, 42: Connector, 51: First metal pattern, 52: First via, 53: Second metal pattern, 54: Second via, 55: First via, 56: Second via, 57: First via, 58: Second via, 60: Third conductor, 71: First insulator, 72: Second insulator.

The invention claimed is:

1. A printed circuit board comprising:
a line formation layer including:
a differential line having a first conductor and a second conductor;
a first component that is a component for a countermeasure against a surge;
a first connection conductor having a first end connected to the first conductor and a second end connected to the first component;
a second component that is a component for a countermeasure against a surge; and
a second connection conductor having a third end connected to the second conductor and a fourth end connected to the second component;
a ground layer; and
a dielectric mounted between the line formation layer and the ground layer, wherein
a first capacitance exists between the first connection conductor as well as the first component and the ground layer, a second capacitance that has a capacitance value different from that of the first capacitance exists between the second connection conductor as well as the second component and the ground layer, and a length of the first conductor and a length of the second conductor are adjusted so that the length of the first conductor is shorter than or longer than the length of the second conductor, depending on a difference in capacitance value between the first capacitance and the second capacitance.

2. The printed circuit board according to claim 1, wherein
a mounting area of the first connection conductor and a mounting area of the second connection conductor in the line formation layer are each adjusted, depending on the difference between the first capacitance and the second capacitance.

3. The printed circuit board according to claim 1, comprising:
a first metal pattern disposed inside the dielectric so as to be electrically connected to the first conductor on the differential line; and
a second metal pattern disposed inside the dielectric so as to be electrically connected to the second conductor on the differential line, wherein
when viewed in a direction from the line formation layer toward the ground layer, the first metal pattern is disposed at a position including a whole of the first connection conductor and a whole of the first component, and the second metal pattern is disposed at a position including a whole of the second connection conductor and a whole of the second component,
the first capacitance is a capacitance existing between the first metal pattern and the ground layer, and
the second capacitance is a capacitance existing between the second metal pattern and the ground layer.

4. The printed circuit board according to claim 1, comprising:

a first dielectric being the dielectric mounted between the line formation layer and the ground layer;
a second dielectric mounted so as to contact a surface of a side on which the first dielectric is not mounted, out of two surfaces of the ground layer;
a first metal pattern disposed inside the first dielectric so as to be electrically connected to the first conductor on the differential line; and
a second metal pattern disposed on a surface of a side on which the ground layer is not arranged, out of two surfaces of the second dielectric, so as to be electrically connected to the second conductor on the differential line, wherein
when viewed in a direction from the line formation layer toward the ground layer, the first metal pattern is disposed at a position including a whole of the first connection conductor and a whole of the first component,
the first capacitance is a capacitance existing between the first metal pattern and the ground layer, and
the second capacitance is a combined capacitance of a capacitance existing between the second connection conductor as well as the second component and the ground layer, and a capacitance existing between the second metal pattern and the ground layer.

5. The printed circuit board according to claim 1, comprising:
a first metal pattern disposed inside the dielectric so as to be elect:deafly connected to the first conductor on the differential line; and
a second metal pattern disposed inside the dielectric so as to be electrically connected to the second conductor on the differential line, wherein
when viewed in a direction from the line formation layer toward the ground layer, the first metal pattern is disposed at a position including a part of the first connection conductor and the first component, and the second metal pattern is disposed at a position including a part of the second connection conductor and the second component,
the first capacitance is a combined capacitance of a capacitance existing between a part not included in the first metal pattern, of the first connection conductor and the first component, and the ground layer, and a capacitance existing between the first metal pattern and the ground layer, and
the second capacitance is a combined capacitance of a capacitance existing between a part not included in the second metal pattern, of the second connection conductor and the second component, and the ground layer, and a capacitance existing between the second metal pattern and the ground layer.

6. The printed circuit board, comprising:
a line formation layer including:
a differential line having a first conductor and a second conductor;
a first component that is a component for a countermeasure against a surge;
a first connection conductor having a first end connected to the first conductor and a second end connected to the first component;
a second component that is a component for a countermeasure against a surge; and
a second connection conductor having a third end connected to the second conductor and a fourth end connected to the second component;
a ground layer;
a dielectric mounted between the line formation layer and the ground layer;
a first metal pattern disposed inside the dielectric so as to be electrically connected to the ground layer; and
a second metal pattern disposed inside the dielectric so as to be electrically connected to the ground layer, wherein
when viewed in a direction from the line formation layer toward the ground layer, the first metal pattern is disposed at a position including a whole of the first connection conductor and a whole of the first component, and the second metal pattern is disposed at a position including a whole of the second connection conductor and a whole of the second component,
the first capacitance exists between the first connection conductor as well as the first component and the first metal pattern, and
the second capacitance that has a capacitance value different from that of the first capacitance exists between the second connection conductor as well as the second component and the second metal pattern, and a length of the first conductor and a length of the second conductor are adjusted so that the length of the first conductor is shorter than or longer than the length of the second conductor, depending on a difference between the first capacitance and the second capacitance.

7. The printed circuit board, comprising:
a line formation layer including:
a differential line having a first conductor and a second conductor;
a first component that is a component for a countermeasure against a surge;
a first connection conductor having a first end connected to the first conductor and a second end connected to the first component;
a second component that is a component for a countermeasure against a surge; and
a second connection conductor having a third end connected to the second conductor and a fourth end connected to the second component;
a ground layer;
a dielectric mounted between the line formation layer and the ground layer;
a first metal pattern disposed inside the dielectric so as to be electrically connected to the ground layer; and
a second metal pattern disposed inside the dielectric so as to be electrically connected to the ground layer, wherein
when viewed in a direction from the line formation layer toward the ground layer, the first metal pattern is disposed at a position including a part of the first connection conductor and the first component, and the second metal pattern is disposed at a position including a part of the second connection conductor and the second component,
the first capacitance exists between a part not included in the first metal pattern, of the first connection conductor and the first component, and the ground layer, and a capacitance existing between the part included in the first metal pattern and the first metal pattern, and
the second capacitance that has a capacitance value different from that of the first capacitance exists between a part not included in the second metal pattern, of the second connection conductor and the second component, and the ground layer, and between the part included in the second metal pattern and the second metal pattern, and a length of the first conductor and a length of the second conductor are adjusted so that the length of the first conductor is shorter than or longer than the length of the second conductor, depending on a difference between the first capacitance and the second capacitance.

8. The printed circuit board, comprising:
a line formation layer including:
a differential line having a first conductor and a second conductor;
a first component that is a component for a countermeasure against a surge;
a first connection conductor having a first end connected to the first conductor and a second end connected to the first component;
a second component that is a component for a countermeasure against a surge; and
a second connection conductor having a third end connected to the second conductor and a fourth end connected to the second component;
a ground layer;
a dielectric mounted between the line formation layer and the ground layer;
a first metal pattern disposed inside the dielectric so as to be electrically connected to the ground layer; and
a second metal pattern disposed inside the dielectric so as to be electrically connected to the second conductor on the differential line, wherein
when viewed in a direction from the line formation layer toward the ground layer, the first metal pattern is disposed at a position including a whole of the first connection conductor and a whole of the first component, and the second metal pattern is disposed at a position including a whole of the second connection conductor and a whole of the second component,
the first capacitance exists between the first connection conductor as well as the first component and the first metal pattern, and
the second capacitance that has a capacitance value different from that of the first capacitance exists between the second metal pattern and the ground layer, and a length of the first conductor and a length of the second conductor are adjusted so that the length of the first conductor is shorter than or longer than the length of the second conductor, depending on a difference between the first capacitance and the second capacitance.

9. The printed circuit board, comprising:
a line formation layer including:
a differential line having a first conductor and a second conductor;
a first component that is a component for a countermeasure against a surge;
a first connection conductor having a first end connected to the first conductor and a second end connected to the first component;
a second component that is a component for a countermeasure against a surge; and
a second connection conductor having a third end connected to the second conductor and a fourth end connected to the second component;
a first dielectric mounted between the line formation layer and the ground layer;
a second dielectric mounted so as to contact a surface of a side on which the first dielectric is not mounted, out of two surfaces of the ground layer;
a first metal pattern disposed inside the first dielectric so as to be electrically connected to the ground layer; and
a second metal pattern disposed on a surface of a side on which the ground layer is not arranged, out of two surfaces of the second dielectric, so as to be electrically connected to the second conductor, wherein
when viewed in a direction from the line formation layer toward the ground layer, the first metal pattern is disposed at a position including a whole of the first connection conductor and a whole of the first component,
the first capacitance exists between the first connection conductor as well as the first component and the first metal pattern, and
the second capacitance that has a capacitance value different from that of the first capacitance between the second connection conductor as well as the second component and the ground layer, and a length of the first conductor and a length of the second conductor are adjusted so that the length of the first conductor is shorter than or longer than the length of the second conductor, depending on a difference between the first capacitance and the second capacitance.

10. The printed circuit board, comprising:
a line formation layer including:
a differential line having a first conductor and a second conductor;
a first component that is a component for a countermeasure against a surge;
a first connection conductor having a first end connected to the first conductor and a second end connected to the first component;
a second component that is a component for a countermeasure against a surge; and
a second connection conductor having a third end connected to the second conductor and a fourth end connected to the second component;
a ground layer;
a dielectric mounted between the line formation layer and the ground layer;
a first metal pattern disposed inside the dielectric so as to be electrically connected to the ground layer; and
a second metal pattern disposed inside the dielectric so as to be electrically connected to the second conductor, wherein
when viewed in a direction from the line formation layer toward the ground layer, the first metal pattern is disposed at a position including a part of the first connection conductor and the first component, and the second metal pattern is disposed at a position including a part of the second connection conductor and the second component,
the first capacitance exists between a part, not included in the first metal pattern, of the first connection conductor and the first component, and the ground layer, and between a part included in the first metal pattern and the first metal pattern, and
the second capacitance that has a capacitance value different from that of the first capacitance exists between a part not included in the second metal pattern, of the second connection conductor and the second component, and the ground layer, and between the second metal pattern and the ground layer, and a length of the first conductor and a length of the second conductor are adjusted so that the length of the first conductor is shorter than or longer than the length of the second conductor, depending on a difference between the first capacitance and the second capacitance.

11. The printed circuit board according to claim 1, wherein a dielectric constant of a dielectric mounted between the first conductor of the differential line and the ground layer, and a dielectric constant of a dielectric mounted between the second conductor of the differential line and the ground layer differ from each other.

12. The printed circuit board according to claim 1, wherein the line formation layer has a third conductor that is electrically connected to either the first conductor or the second conductor on the differential line.

13. A printed circuit board comprising:
a line formation layer including a differential line having a first conductor and a second conductor;
a connection conductor forming layer including a first component that is a component for a countermeasure against a surge, a first connection conductor having a first end connected to the first conductor and a second end connected to the first component, a second component that is a component for a countermeasure against a surge, and a second connection conductor having a third end connected to the second conductor and a fourth end connected to the second component;
a ground layer;
a first dielectric mounted between the line formation layer and the ground layer; and
a second dielectric mounted between the ground layer and the connection conductor forming layer, wherein
a second capacitance that has a capacitance value different from that of the first capacitance exists between the second connection conductor as well as the second component and the ground layer a length of the first conductor and a length of the second conductor are adjusted so that the length of the first conductor is shorter than or longer than the length of the second conductor, depending on a difference in capacitance value between the first capacitance and the second capacitance.

14. The printed circuit board according to claim 13, wherein a mounting area of the first connection conductor and a mounting area of the second connection conductor in the connection conductor forming layer are each adjusted depending on a difference between the first capacitance and the second capacitance.

15. The printed circuit board according to claim 13, comprising:
a first metal pattern disposed inside the second dielectric so as to be electrically connected to the first conductor on the differential line and electrically connected with either the first connection conductor or the first component; and
a second metal pattern disposed inside the second dielectric so as to be electrically connected to the second conductor on the differential line and electrically connected to either the second connection conductor or the second component, wherein
when viewed in a direction from the line formation layer toward the ground layer, the first metal pattern is disposed at a position including a whole of the first connection conductor and a whole of the first component, and the second metal pattern is disposed at a position including a whole of the second connection conductor and a whole of the second component,
the first capacitance is a capacitance existing between the first metal pattern and the ground layer, and
the second capacitance is a capacitance existing between the second metal pattern and the ground layer.

16. The printed circuit board according to claim 13, comprising:
a first metal pattern disposed inside the second dielectric so as to be electrically connected to the first conductor on the differential line and electrically connected to either the first connection conductor or the first component; and
a second metal pattern disposed inside the second dielectric so as to be electrically connected to the second conductor on the differential line and electrically connected to either the second connection conductor or the second component, wherein
when viewed in a direction from the line formation layer toward the ground layer, the first metal pattern is disposed at a position including a. part of the first connection conductor and the first component, and the second metal pattern is disposed at a position including a part of the second connection conductor and the second component,
the first capacitance is a combined capacitance of a capacitance existing between a part not included in the first metal pattern, of the first connection conductor and the first component, and the ground layer, and a capacitance existing between the first metal pattern and the ground layer, and
the second capacitance is a combined capacitance of a capacitance existing between a part not included in the second metal pattern, of the second connection conductor and the second component, and the ground layer, and a capacitance existing between the second metal pattern and the ground layer.

* * * * *